US008218324B2

(12) United States Patent
Jones

(10) Patent No.: US 8,218,324 B2
(45) Date of Patent: Jul. 10, 2012

(54) MODULE FOR HOUSING ELECTRONIC COMPONENTS AND METHOD OF MANUFACTURING THE SAME

(75) Inventor: Thomas L. Jones, Madison, AL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 409 days.

(21) Appl. No.: 12/485,382

(22) Filed: Jun. 16, 2009

(65) Prior Publication Data

US 2010/0315792 A1   Dec. 16, 2010

(51) Int. Cl.
*H05K 5/00* (2006.01)

(52) U.S. Cl. ................ 361/752; 361/796; 361/800

(58) Field of Classification Search ......... 361/728–730, 361/752, 797, 800, 788, 767, 777, 796, 807, 361/810
See application file for complete search history.

(56) References Cited

U.S. PATENT DOCUMENTS

| | | | | |
|---|---|---|---|---|
| 4,603,928 A * | 8/1986 | Evans | ............................. | 439/61 |
| 5,777,856 A * | 7/1998 | Phillips et al. | ................ | 361/816 |
| 6,268,999 B1 * | 7/2001 | Tg | ............................. | 361/679.02 |
| 6,735,093 B2 * | 5/2004 | Mu-Tsai | ........................ | 361/818 |
| 6,768,654 B2 * | 7/2004 | Arnold et al. | .................. | 361/818 |
| 6,780,030 B2 * | 8/2004 | Yoshinaga et al. | ............... | 439/92 |
| 7,324,348 B2 * | 1/2008 | Berg et al. | ...................... | 361/752 |
| 7,576,993 B2 * | 8/2009 | Hsieh et al. | .................... | 361/753 |

* cited by examiner

*Primary Examiner* — Hung S Bui

(57) ABSTRACT

A module includes an outer housing comprising an additive. A first holder is disposed so as to be in integral relationship the outer housing. A second holder is disposed so as to be in integral relationship with the outer housing. A first circuit board is in removable engagement with first holder and the first circuit board adapted to being held in place by the holder without the use of a fastener. A second circuit board is in removable engagement with the second holder, the second circuit board adapted to being held in place by the holder without the use of a fastener. At least one electrical trace element is disposed so as to be in integral relationship with the outer housing. A conductive portion of the trace element provides a first electrical pathway between the first circuit board and the second circuit board. The insulator material and the additive act to provide electromagnetic compatibility (EMC) shielding for electrical components disposed within the outer housing.

13 Claims, 14 Drawing Sheets

MODULE FOR HOUSING ELECTRONIC COMPONENTS AND METHOD OF MANUFACTURING THE SAME

FIELD OF THE INVENTION

The field of the invention relates to modules for housing electronics and methods of manufacturing the same.

BACKGROUND

Various types of modules or housings have been used through the years to house various types of electronic components. For example, various types of modules have been used to house radio components and these radio modules are often disposed in vehicles. Other modules used in vehicles may provide other multi-media functions such as video, Internet, music, or other types of services to the vehicle's user.

The construction of radio modules (or other modules used to provide multi-media functions) typically utilizes metals to provide electromagnetic compatibility (EMC) shielding. The metal construction provides some degree of shielding of the components from various types of electromagnetic interference. In addition, the metal structure provides some level of geometric stability for the components located inside by protecting these components to some extent from physical jarring, bumping, and other forces that might damage the components and/or render the system inoperative.

Typically, the above-mentioned modules are assembled from pre-cut or preformed parts. Only then (after the outer module is assembled) can the electronic components be added to the assembled outer structure. The parts used to construct the module are cut or formed to very tight tolerances and/or are formed from plastic housings that typically do not provide EMC protection.

The above-mentioned previous systems suffer from several disadvantages. More specifically, the assembly process for constructing such a module is complicated, requires that parts are built and assembled to relatively tight tolerances, requires circuit connections to be made in tight spaces with limited visibility to the installer, and often requires several fasteners to finish and secure the various parts. Moreover, EMC protection is often not provided.

Previous approaches have attempted to overcome the above-mentioned problems by using complex machinery and/or increasing the training of the personnel that assemble the modules. However, this led to an increased cost for the assembly process (and final product) and was time-consuming and disadvantageous due to the human error that is typically introduced in the assembly process.

Figure 1:
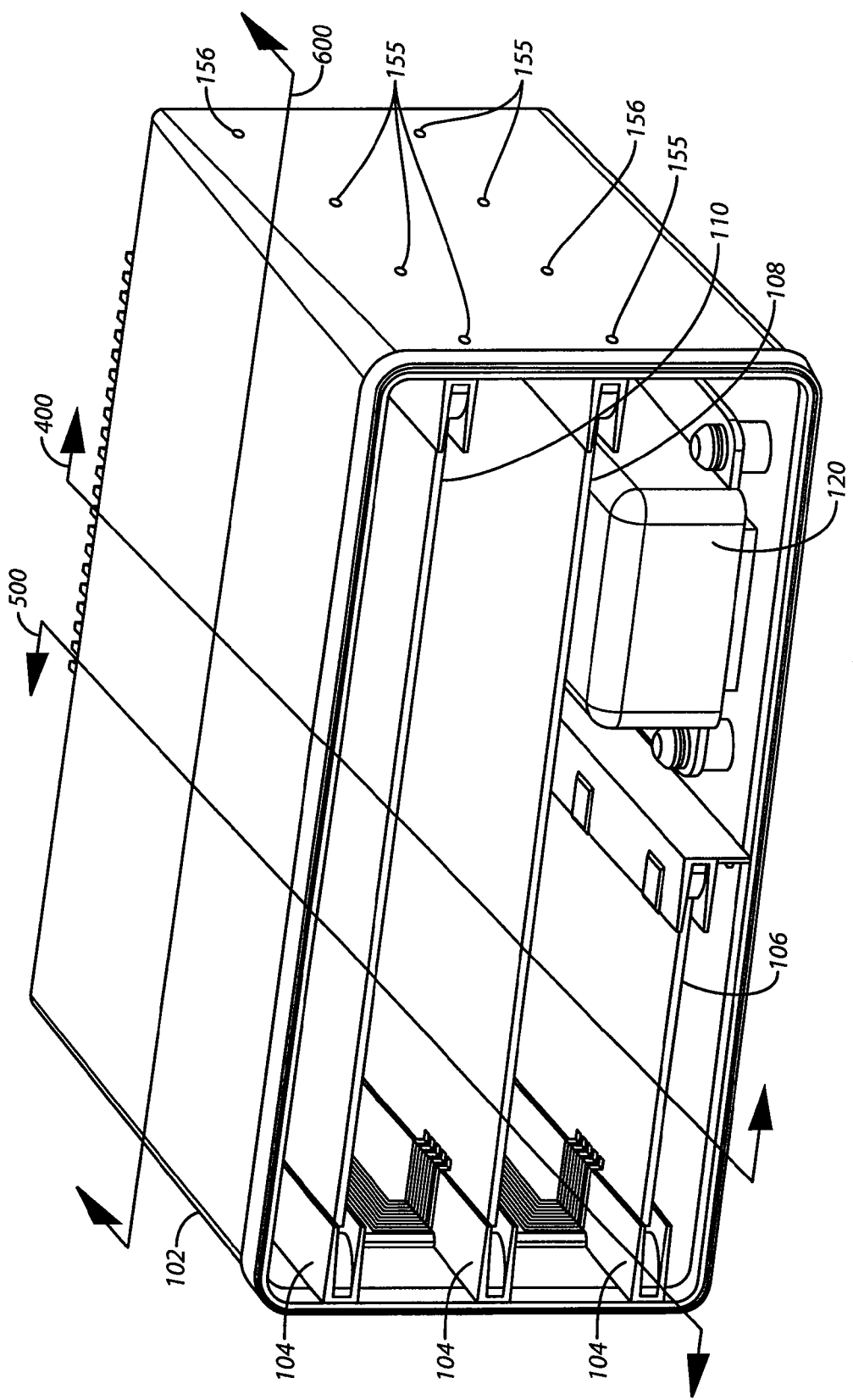
FIG. 1 comprises a front perspective view of a module according to various embodiments of the present invention.
Figure 2:
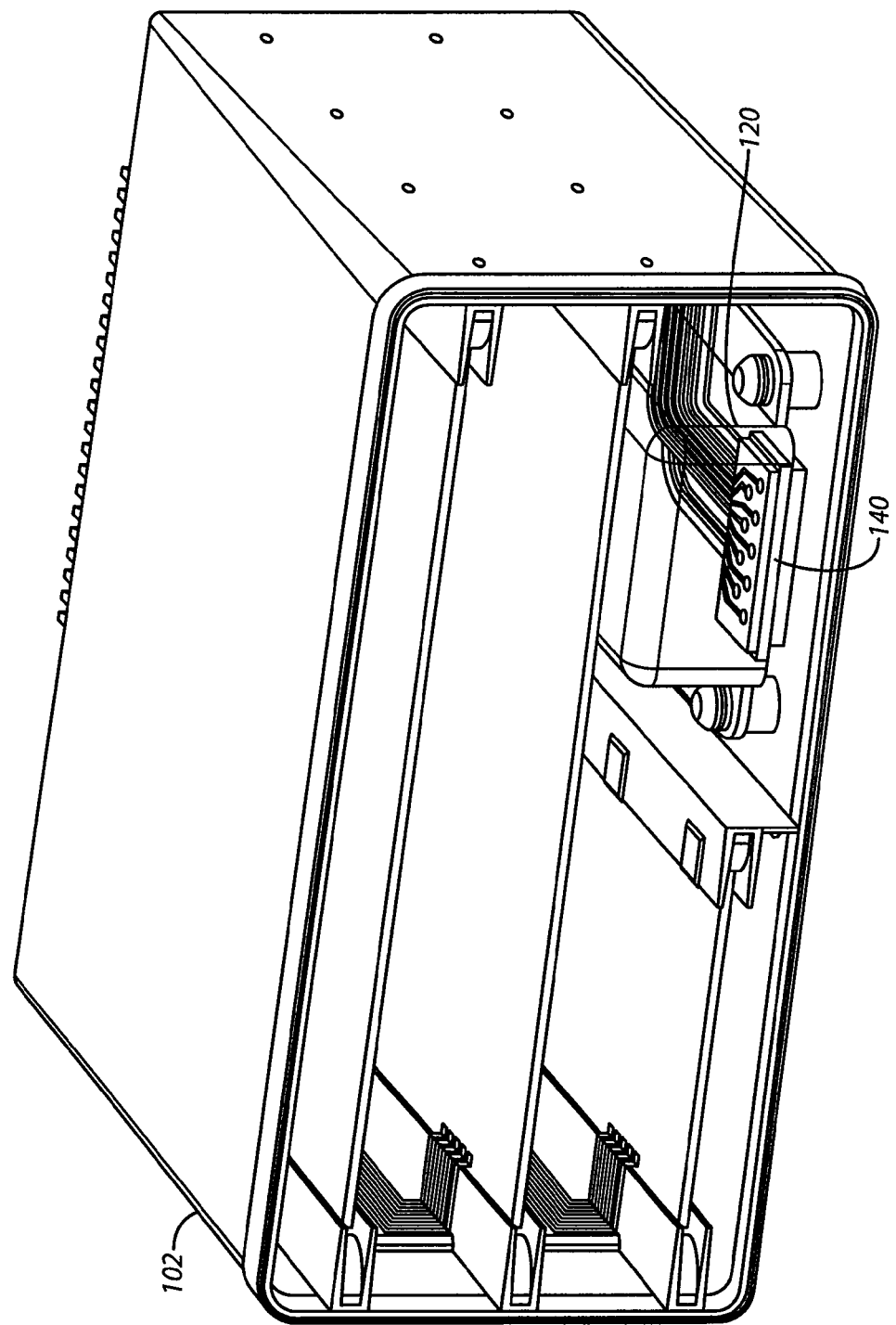
FIG. 2 comprises another front perspective view of the module of FIG. 1 showing a cutaway view of the module according to various embodiments of the present invention.
Figure 3:
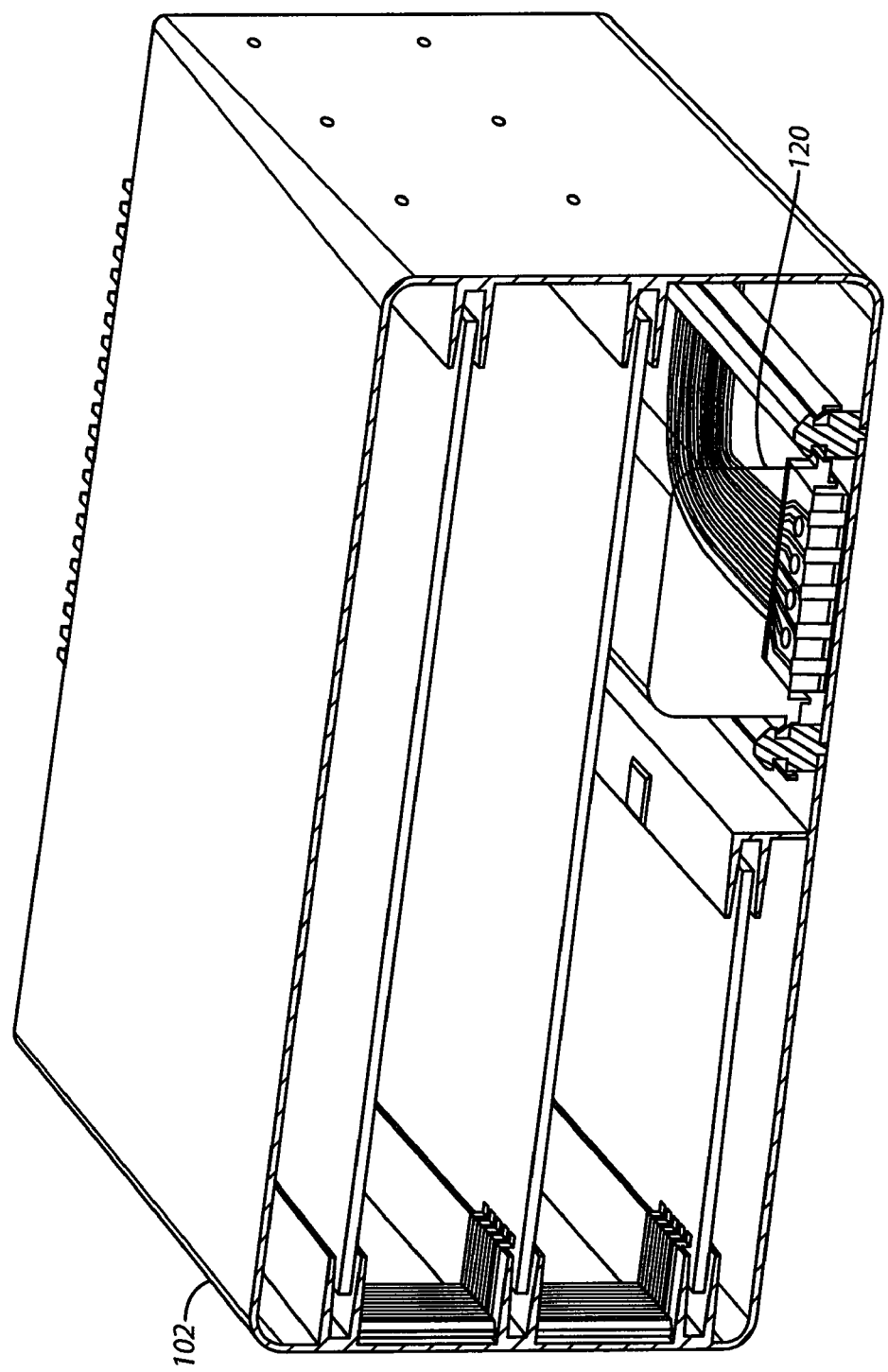
FIG. 3 comprises another front perspective view of the module viewed from a different vantage point according to various embodiments of the present invention.
Figure 4:
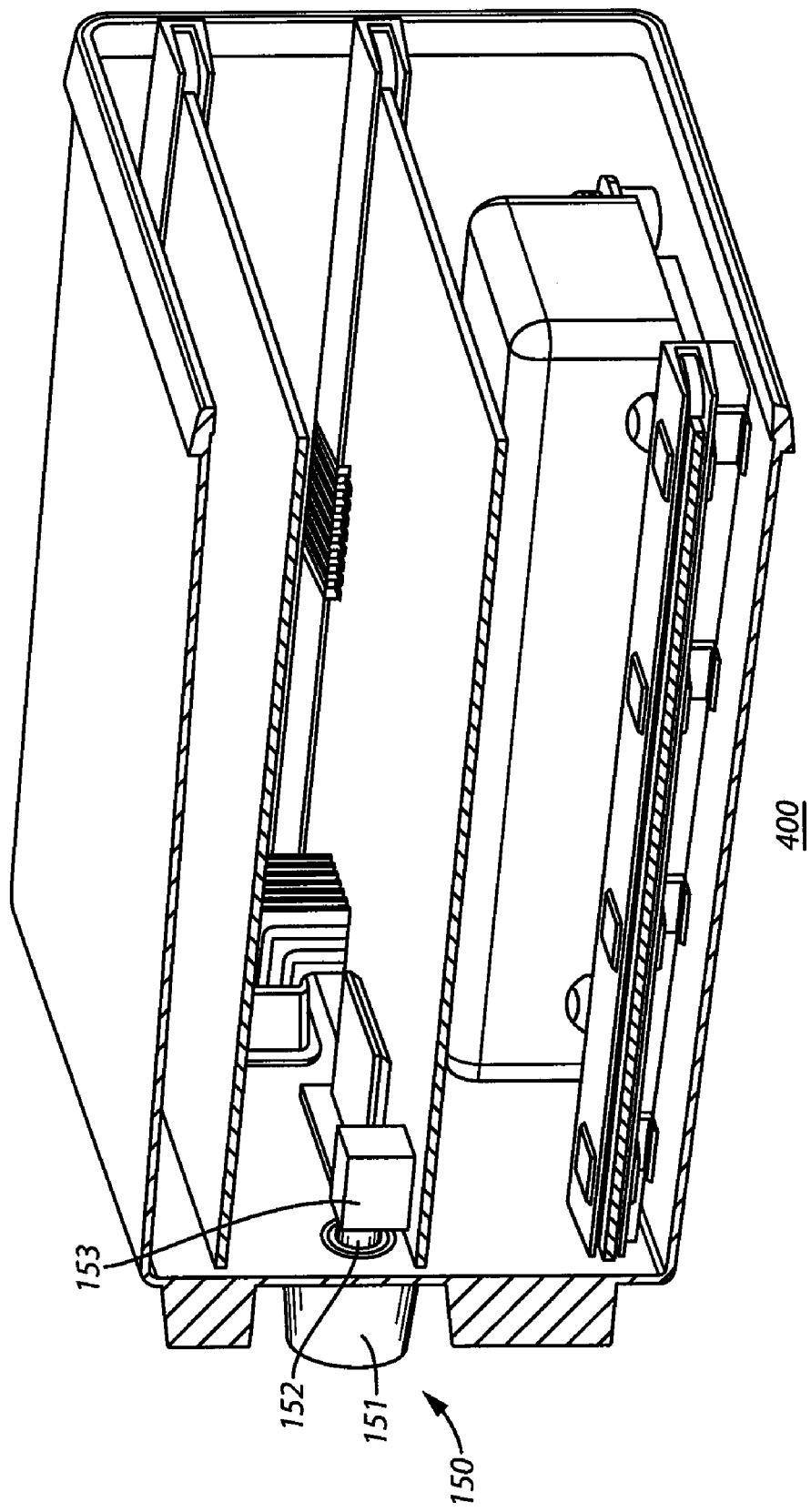
FIG. 4 comprises a perspective cutaway view of the module along line 400 of FIG. 1 according to various embodiments of the present invention.
Figure 5:
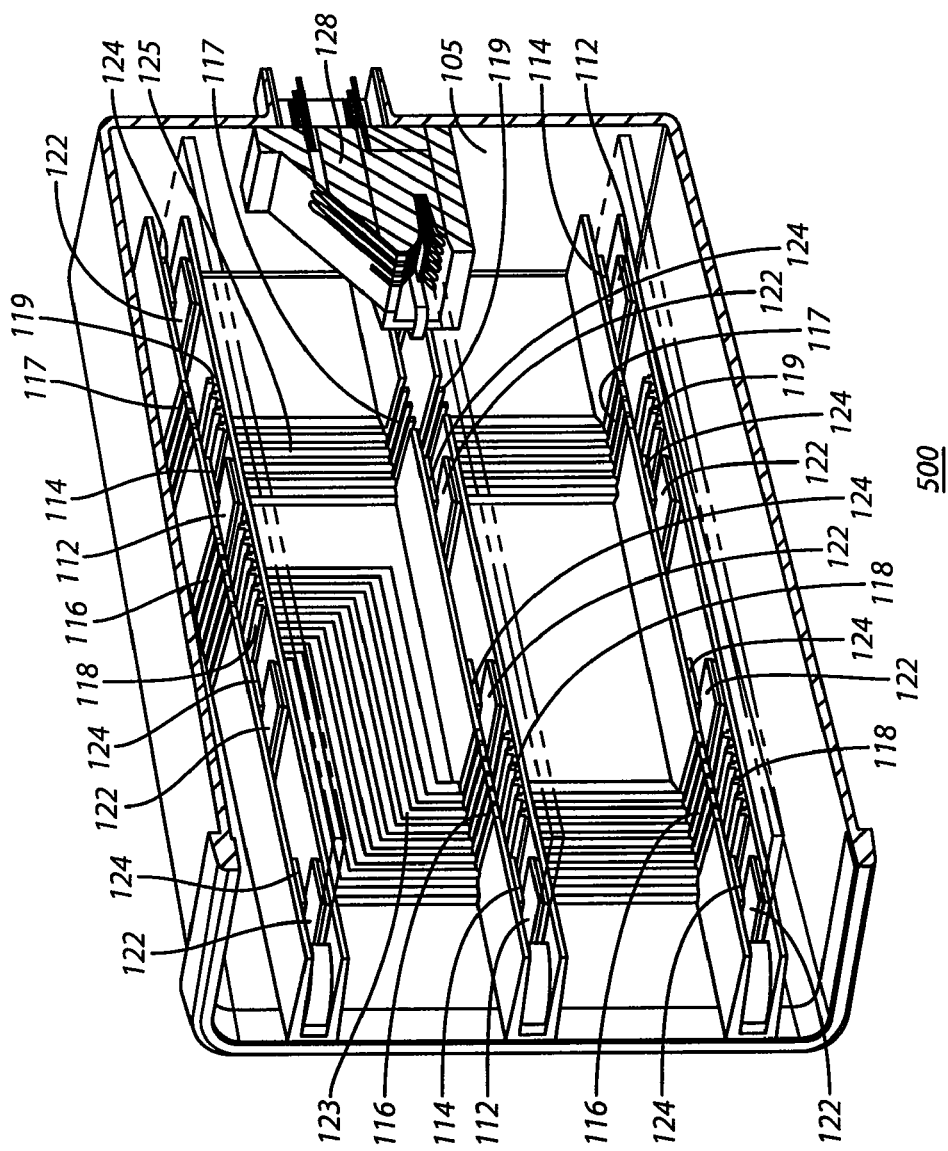
FIG. 5 comprises a perspective cutaway view of the module along line 500 of FIG. 1 according to various embodiments of the present invention.
Figure 6:
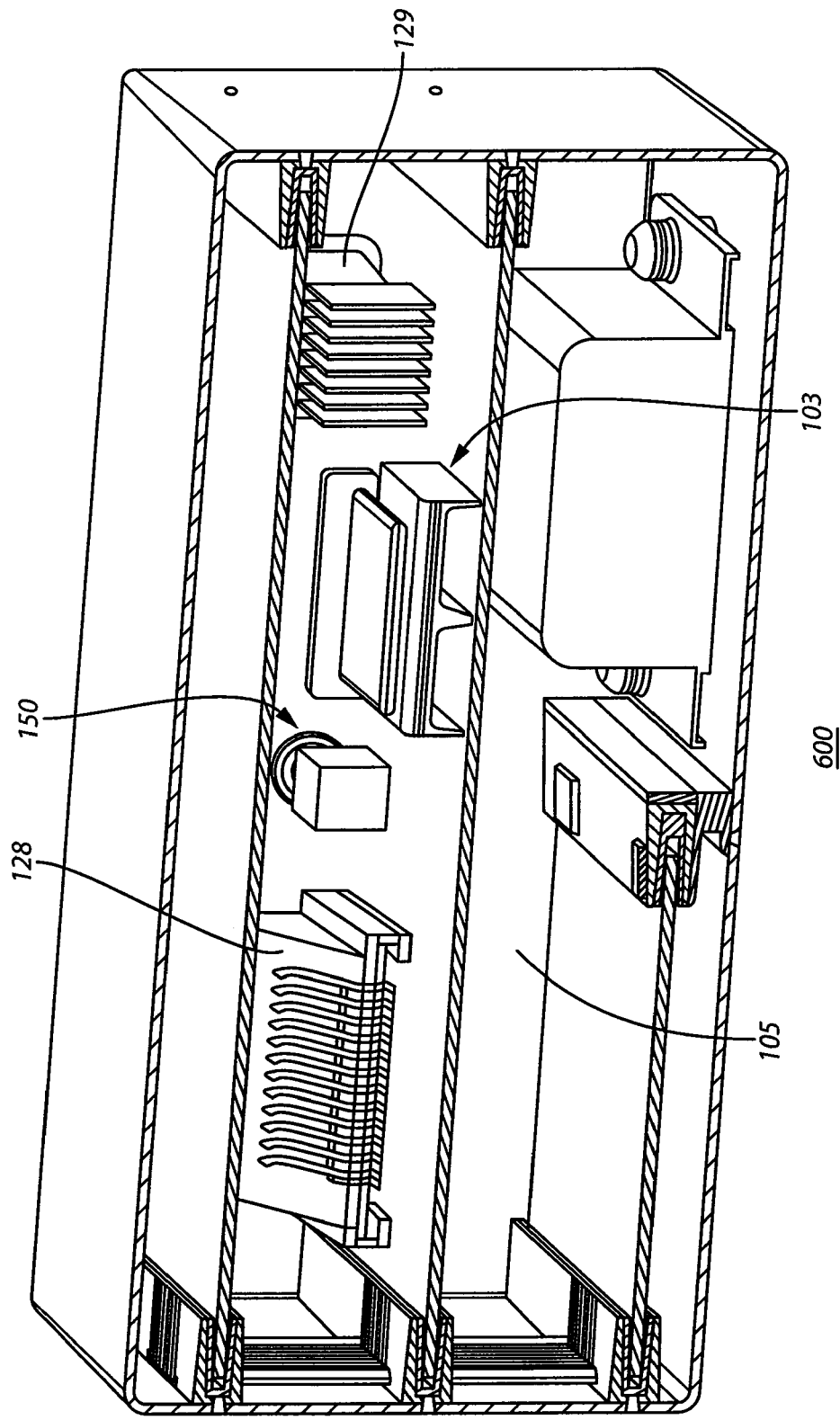
FIG. 6 comprises a perspective cutaway view of the module along line 600 of FIG. 1 according to various embodiments of the present invention.
Figure 7:
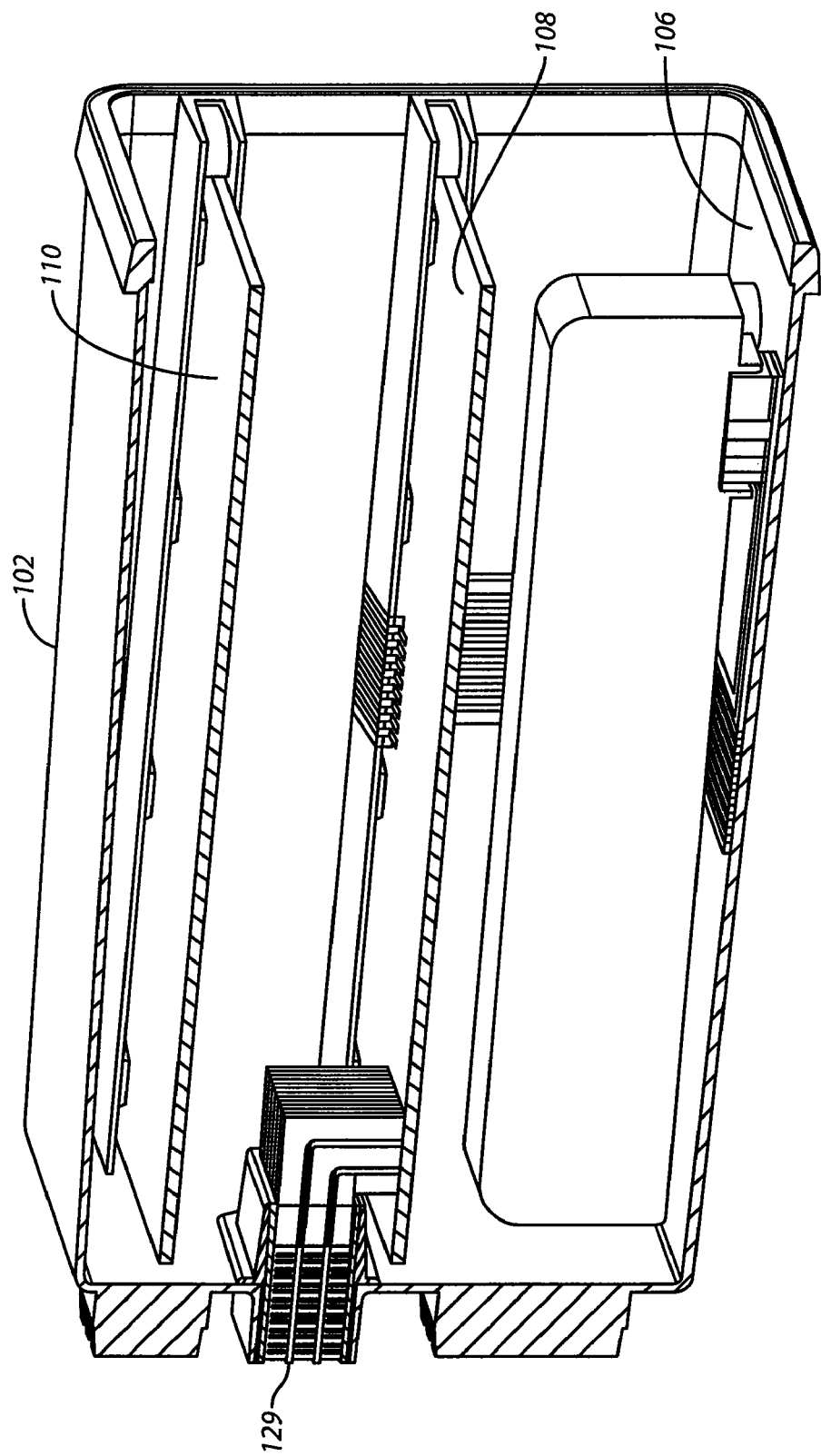
FIG. 7 comprises another perspective cutaway view of the module along line 400 of FIG. 1 according to various embodiments of the present invention.
Figure 8:
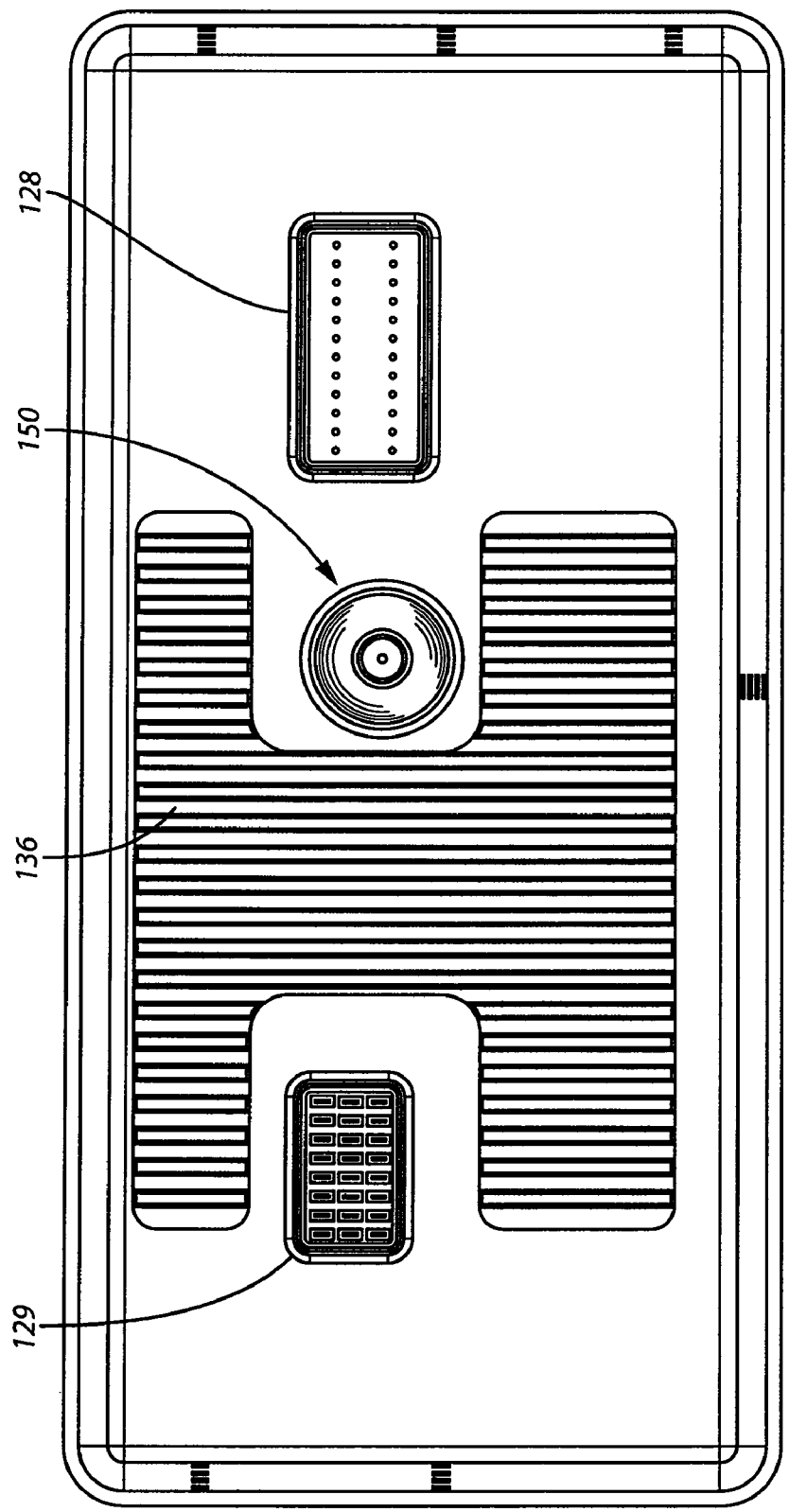
FIG. 8 comprises a back view of the module of FIGS. 1-7 according to various embodiments of the present invention.
Figure 9:
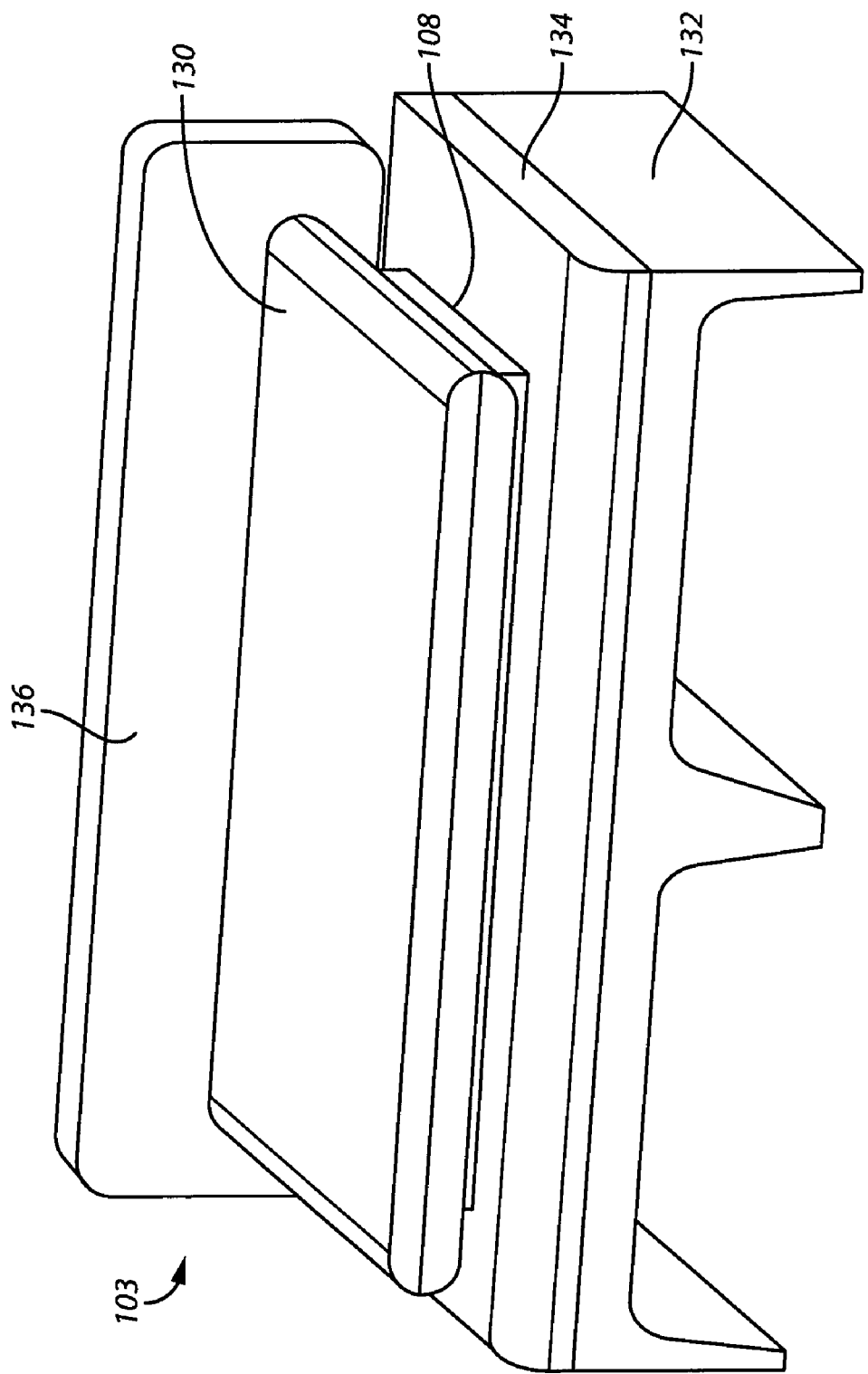
FIG. 9 comprises a view of a circuit board support element according to various embodiments of the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Housings or modules for electronic components and methods of constructing these housings or modules are provided. Using these approaches, electromagnetic compatibility (EMC) shielding is provided for the electronic components disposed within the housing. Additionally, features secondary to the overall structure of the housing (e.g., component mountings, electrical interconnections, and thermal adjustment features) are incorporated into the overall housing structure easily and quickly. As a result and to name a few examples, circuit boards may be slid into and out of the housing without the need to mate connectors of the circuit boards using a separate or secondary process or apply fasteners to retain the circuit boards in place. To take another example, electrical interconnections need not be separately applied to the housing via a special process after the housing has been otherwise assembled. And in yet another example, thermal adjustment features are fully integrated with the housing and need not be separately constructed after the module is otherwise complete.

In so doing, the additional, complicated, and costly processes used in previous approaches (e.g., manually making connections in place or separately constructing a heat sink once the housing was complete) are avoided or eliminated. Easier user interaction with the module is provided, the time required to assemble the module is reduced, the final cost of the module is decreased, and installer/assembler frustration with assembling the module is minimized.

In many of these embodiments, a module includes an outer housing and the outer housing includes an additive. A first holder is disposed so as to be in integral relationship the outer housing and a second holder is also disposed so as to be in integral relationship with the outer housing. A first circuit board is moved into removable engagement with first holder and the first circuit board is adapted to being held in place by the holder without the use of a fastener or fasteners. A second circuit board is placed into removable engagement with the second holder and the second circuit board is adapted to being held in place by the holder without the use of a fastener or fasteners.

One or more electrical trace elements are disposed so as to be in integral relationship with the outer housing (e.g., formed in the housing or otherwise secured to the housing to form a single continuous unit). The insulator material and the additive act to provide electromagnetic compatibility (EMC) shielding for electrical components disposed within the outer housing. The electrical trace elements are coupled to the first circuit board at a first connector and are coupled to the second circuit board at a second connector. The electrical trace elements are configured to provide a first electrical pathway between the first circuit board and the second circuit board. A third connecter is additionally coupled to the electrical trace elements. The third connector is disposed so as to be in integral relationship with the outer housing but is not integrated with either the first circuit board or the second circuit board. The third connector provides a second electrical pathway from at least one of the first circuit board or second circuit board to a device external of the outer housing.

The holders may be integrated with the housing in a variety of different ways. In one example, the first holder and the second holder are fastened to the outer housing via a fastener. In another example, the first holder and the second holder are formed so as to be coextensive with the outer housing.

The electrical trace elements can be constructed from many different materials. For example, the electrical trace elements can be constructed from a conductive material surrounded by a non-conductive material such as a non-conductive plastic, a non-conductive silicone, or a non-conductive rubber. Other examples of materials may also be used.

The outer housing itself may also be constructed from a wide variety of materials. For example, the outer housing may be constructed from a conductive plastic, a conductive silicone, and a conductive rubber to name a few examples.

In others of these embodiments, a module for housing radio components includes an outer housing. The outer housing comprises an insulator material (e.g., surrounding a conductive trace) and an additive. The insulator material and the additive act to provide electromagnetic compatibility (EMC) shielding for electrical components disposed within the outer housing. A circuit card holder is disposed so as to be in integral relationship with the housing. A circuit card is configured to slide into the circuit card holder. The circuit card holder holds the circuit card in place without the need for fasteners. The circuit card includes a grounding surface that mates with a grounding surface on the circuit card holder thereby providing a path to ground via the outer housing and the path to ground effective for grounding the circuit card.

In others of these embodiments, a method of manufacturing a module that includes electronic components is provided. An outer housing is formed and the outer housing includes an insulator material (e.g., surrounding an electrical trace) and an additive. The insulator material and the additive act to provide electromagnetic compatibility (EMC) shielding for electrical components disposed within the outer housing. One or more non-conductive holders are formed and integrated with the outer housing. One or more circuit boards are slid into attachment with the at least one non-conductive holder. The attachment occurs without the use of fasteners and is effective to hold the circuit boards in place.

In some examples, a grounding path is provided from the circuit board to ground via the outer housing. In other examples, an electrical path is provided to an electrical component via the conductive path.

In many of these embodiments, the outer housing is formed from a molding process. In other examples, the non-conductive holders are separately formed and attached to the outer shell. In yet other examples, the outer shell comprises a plurality of sub-portions. In other approaches as described herein, the holder is formed first and the outer shell are subsequently formed around the at least one holder and around the at least one conductive element.

The outer shell or the holder may be formed according to a variety of approaches. For example, these components may be formed from a molding process such as single-shot molding, multi-shot molding, or insert molding. Other approaches may also be used.

As will be appreciated, the components form a fully integrated housing unit that incorporates many features that are secondary to the overall structure of the housing but that are needed to hold and interconnect various electrical components contained within the housing. For example, holders/retainers for circuit cards disposed within the housing are fully integrated within/into the housing to allow for the circuit cards to be easily slid into place and removed. More specifically and to take one example, the holders/retainers that are incorporated or integrated into the housing may be formed with the housing or formed separately and later fixed to the housing. To take another example, electrical interconnects can also be integrated with the housing either being formed together with the housing (i.e., imbedded into or otherwise coextensive with the housing) or formed separately and later applied to or imbedded in the housing.

The fully integrated nature of the housing facilitates the easy assembly (and in some cases the reassembly) of the electrical components housed therein. It will be appreciated that the human effort needed to fully populate the housing with electronic components is reduced. A modular snap-together approach is provided where the various mechanical components can be assembled and the electrical components provided with a minimum of assembler effort. The housing also incorporates EMC shielding approaches thereby protecting the electronic components of the housing from potential damage from interference or electromagnetic signals.

Referring now to the drawings and collectively to FIGS. 1-10 and 12, one example of an integrated module 100 is described. The module 100 includes an outer housing or shell 102. In one example, the outer housing 102 may be formed from a thermally robust plastic formulation (e.g., PC-ABS) that also includes additives (e.g., glass filler) for EMC shielding. Other materials may also be used to form the outer housing and the additives. The use of these materials causes the outer housing 102 to become electrically conductive.

It will be appreciated that the module described herein with respect to FIGS. 1-10 and 12 is only one possible arrangement that can be constructed according the present principles and that other examples of modules or housings are possible. For example, any number of circuit boards can be used and included in the modules. In another example, the configuration and placement of these circuit boards can vary. Further, although the arrangement described herein is particularly appropriate for radio or multimedia modules, it will be appreciated that the principles described herein can be used with electronic components that provide any type of electrical or electronic functionality. Also, it will be understood that the dimensions described herein can be varied based upon the needs of the user and the requirements of the system.

Supports 104 are used to secure or hold circuit boards 106, 108, and 110 within the housing 102. The supports 104 can be in-molded with the housing 102, insert molded with the housing 102, or formed separately from the housing 102 and then snapped onto the inner walls of the housing 102. In one example, the supports 104 are constructed of a compliant material such as a compliant plastic. So configured, the supports 104 are flexible so as to be forced open when the circuit boards are inserted, but snap back to their original form (or near original form) when the circuit boards 106, 108, or 110 are in place. In other words, the pressure produced by the compliant material (its tendency to assume its original form) retains the circuit boards 106, 108, and 110 in place. In one example, the compliant material used to form the supports 104 is or a silicone. Other examples of compliant materials may also be used.

A heat sink 103 provides for thermal management of the circuit boards 106, 108, and/or 110 and is coupled to a rear wall 105 of the outer housing 102. As especially shown in FIG. 9, the heat sink 103 includes a heat sink flange 130, a rigid shelf 132, and a compliant element 134. The compliant element 134 is constructed of a compliant material (e.g., a compliant plastic) and thereby supports and secures the circuit board 108. As mentioned, the supports 104 are also constructed of compliant material and may be overmolded or snapped to the wall of the outer housing 102. A thermal connector 136 extends through the rear wall 105 and couples the heat sink flange 130 to the exterior surface of the rear wall 105. Heat or other thermal energy flows or is conducted from the circuit board to the flange and then to the connector 136. Consequently, excess heat is dissipated from the circuit board 108 (and other internal components of the module 100) and thermal management is provided for the module 100.

A floating module 140 is incorporated in a power supply 120. Compliant conductive material is in-molded to non-conductive material. The compliant non-conductive or insulator material is surrounded by a rigid material which, in turn, is surrounded by conductive material. This arrangement affords a floating connection that permits some measure of misconnection between circuit board terminals and exterior connector terminals while maintaining a secure electrical contact.

A connection guide 150 extends through the rear wall 105. The connection guide 150 includes a connector 151, a tube 152 extending through the rear wall 105, and an anchoring base 153 attached to one of the supports 104. The connection guide 150 may be constructed from rigid or compliant non-conductive material and may be in-molded to form connection guides for external connectors. Thus, external connectors may be coupled to the connection guide 150.

Although the various conductive or non-conductive components may be incorporated into the housing 102 without the use of any separate fastener, some or all of these components may be anchored to the housing 102 using bolts, screws, or other fastening arrangements. Conductive fasteners 155 anchor various conductive components to the housing 102, while non-conductive fasteners 156 anchor non-conductive components to the housing 102.

As mentioned, within the outer housing 102 are supports 104. The supports 104 are formed from non-conductive materials such as non-conductive plastics. The supports 104 extend around the side walls and rear walls of the outer housing 102.

Electrical circuit boards 106, 108, and 110 are slid into the supports 104. As shown especially in FIG. 5, each of the circuit boards 108, 110, and 112 includes a conductive pad that mates to a conductive pad 114 on the supports 104. This provides a grounding connection for the circuit boards 106, 108, and 110. Trace elements 123 and 125 (including conductive and insulator portions) extend are embedded or otherwise attached to the outer housing 102 and extend to connection areas 116 and 117. The connection areas 116 and 117 mate to corresponding connection areas 118 and 119 on the circuit boards 106, 108, and 110. The trace elements 123 and 125 provide for the interconnection of the boards 106, 108, and 110 so that signals can be transmitted and received between the boards 106, 108, and 110. The trace elements also provide a connection to a power supply 120. Power may be input at a power input 129.

Retention elements 122 are included, incorporated, attached, or otherwise coupled to the circuit board and include corresponding retention elements 124 in the supports 104. The retention elements 122 help prevent the circuit boards 106, 108, and 110 from moving when placed within the housing 102. The retention of the boards 106, 108, and 110 prevents damage to these circuit boards and their components. The retention elements 122 may be made of compliant plastic or silicone to name two examples. The retention elements 122 may also be used for grounding (e.g., as are the elements 116 and 118) when these elements are constructed of conductive materials.

Electrical traces elements 123 and 125 may be integrated into the wall of the outer housing 102. The electrical trace elements 123 and 125 may be constructed from compliant conductive material onto a rigid non-conductive material (e.g., a rigid plastic) or a compliant non-conductive material (e.g., a compliant plastic). To take one example, and as especially shown in FIG. 12, conductive elements 161 of the trace element structure are surrounded by non-conductive material 163. Thus, when incorporated or integrated with the outer housing, signals from the conductive portions of the trace element do not leak or bleed through to the outer housing 102 which, itself is electrically conductive.

A connector 128 includes embedded metal external terminal and provides an edge connection to the circuit board 108 or others of the interconnected boards. The connector 128 receives signals from external devices and communicates these signals to the boards 106, 108, or 110 of the module 100. In addition, signals from the boards 106, 108, or 110 can be communicated to external devices, systems, or networks via the connector 128. The connector 128 may be any type of connector of any type of shape or configuration capable of making these connective arrangements.

The dimensions of the module and its components may vary. In one example, the module is 100 mm high, 230 mm wide, and 150 mm deep. The thickness of the walls may be as needed based upon the applications but generally 1.5 mm to 5 mm and 2 mm in one example. Further the circuit boards may be spaced based upon the clearance for populated components, external requirements for connector position, but generally any distance from 6 mm to 20 mm apart. It will be appreciated that these dimensions are one example only and that these dimensions may be varied according to the requirements of the system or the components housed within the module 100.

Figure 10A:
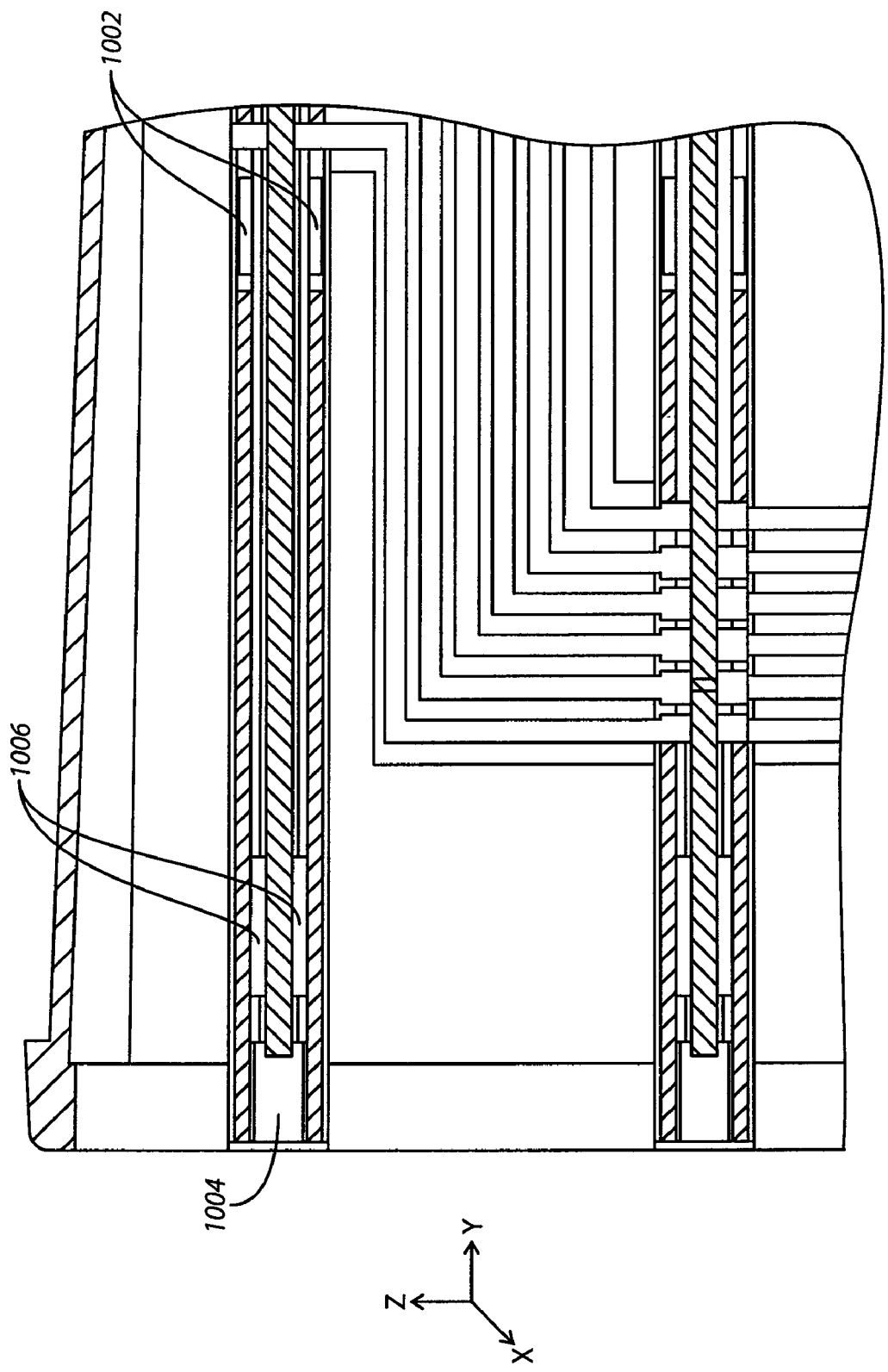
FIG. 10A comprises a view of one example of the integrated retention features of a circuit board according to various embodiments of the present invention.
Figure 10B:
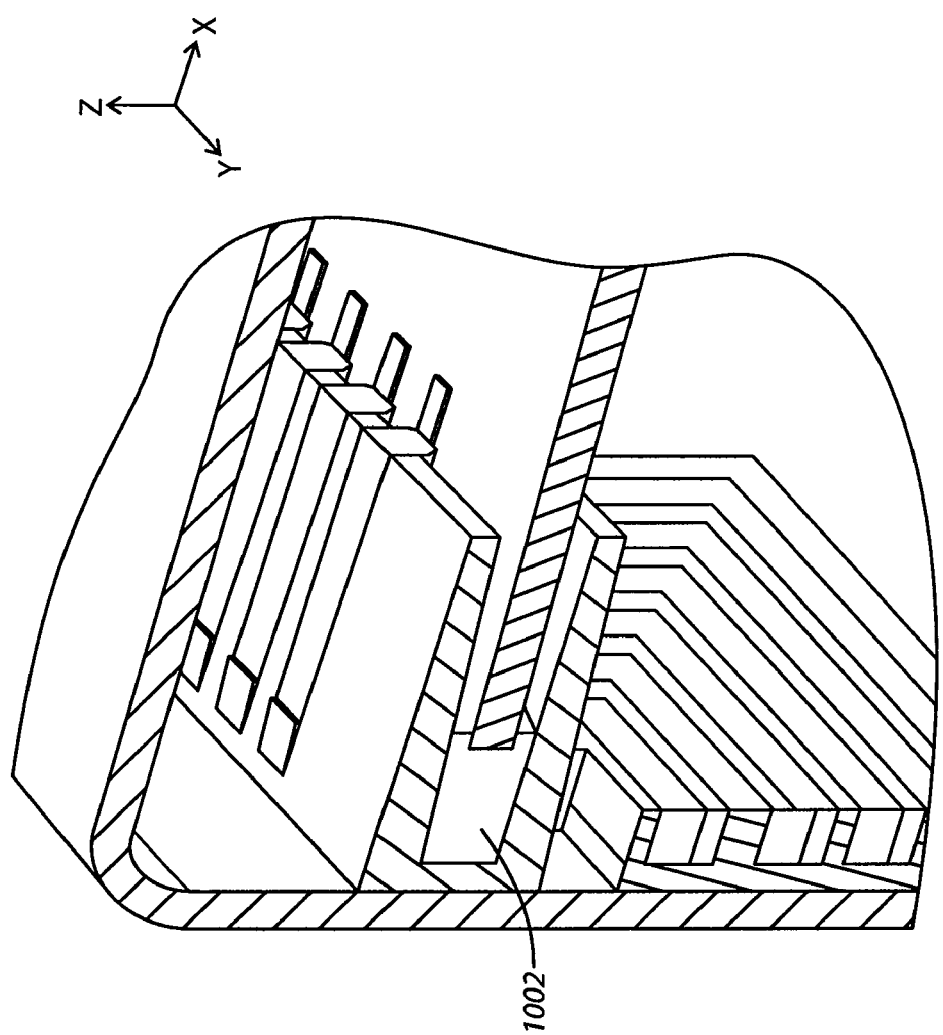
FIG. 10B comprises another view of the integrated retention features of the circuit board of FIG. 10A according to various embodiments of the present invention.
Figure 10C:
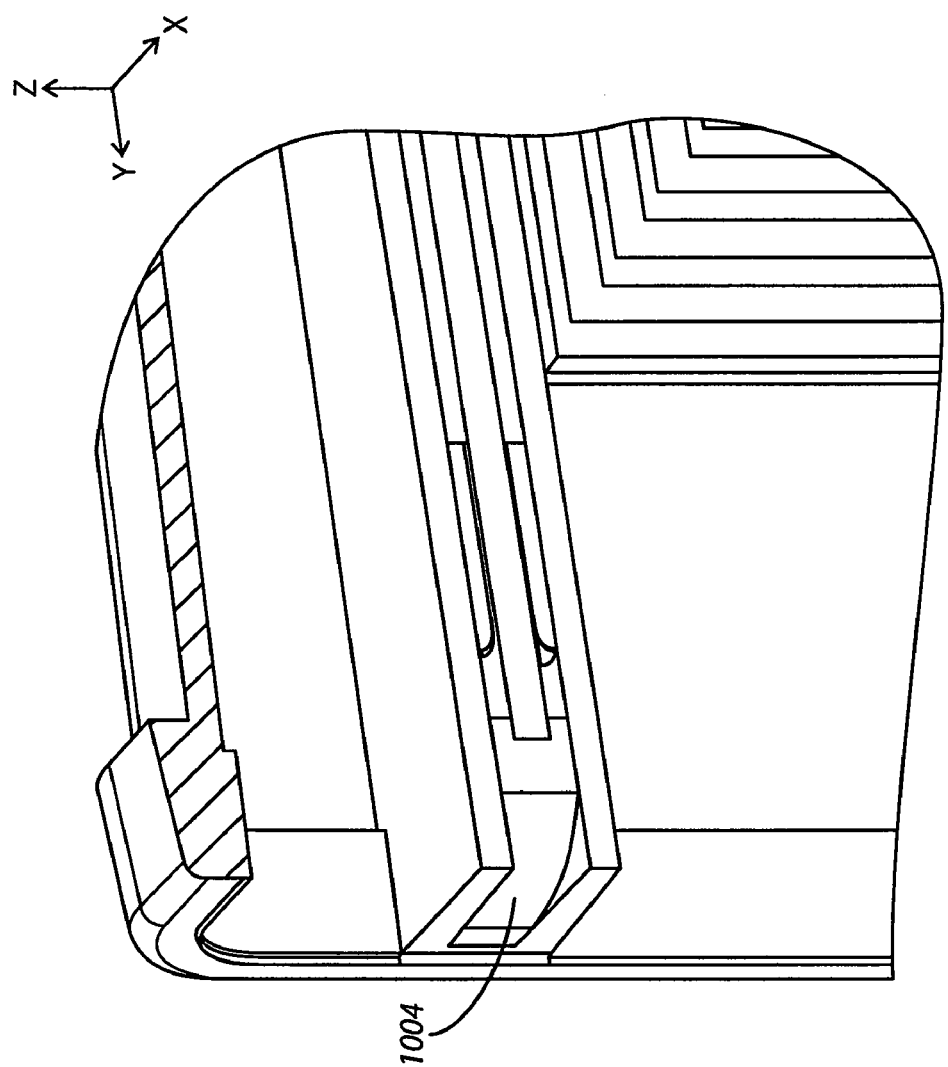
FIG. 10C comprises another view of the integrated retention features of the circuit board of FIGS. 10A and 10B according to various embodiments of the present invention.

Referring now particularly to FIGS. 10A-C, one example of the retention features of the present module is described. Element 1002 holds a circuit board along the x-axis. Element 1004 holds the circuit board along the y-axis. Element 1006 holds the circuit board along the z-axis. Consequently, movement along these axes is prevented using features that are fully integrated with the outer housing 102.

Figure 11:
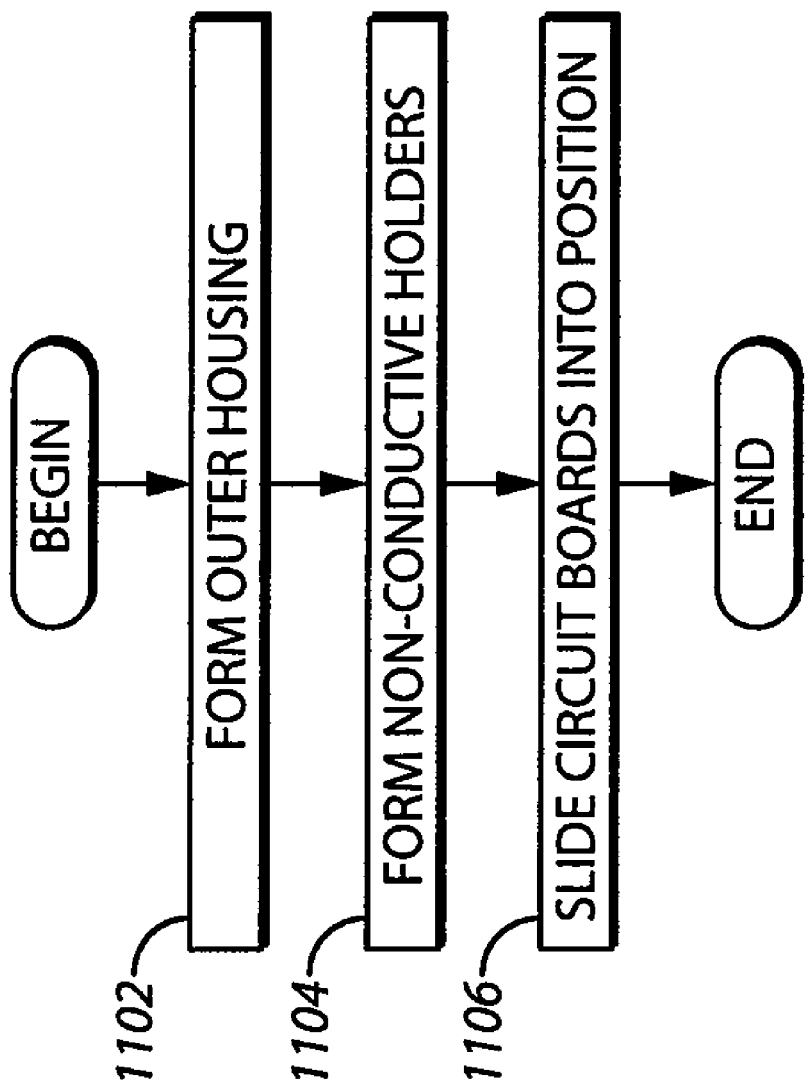
FIG. 11 comprises one example of a method of manufacturing a module according to various embodiments of the present invention.
Figure 12:
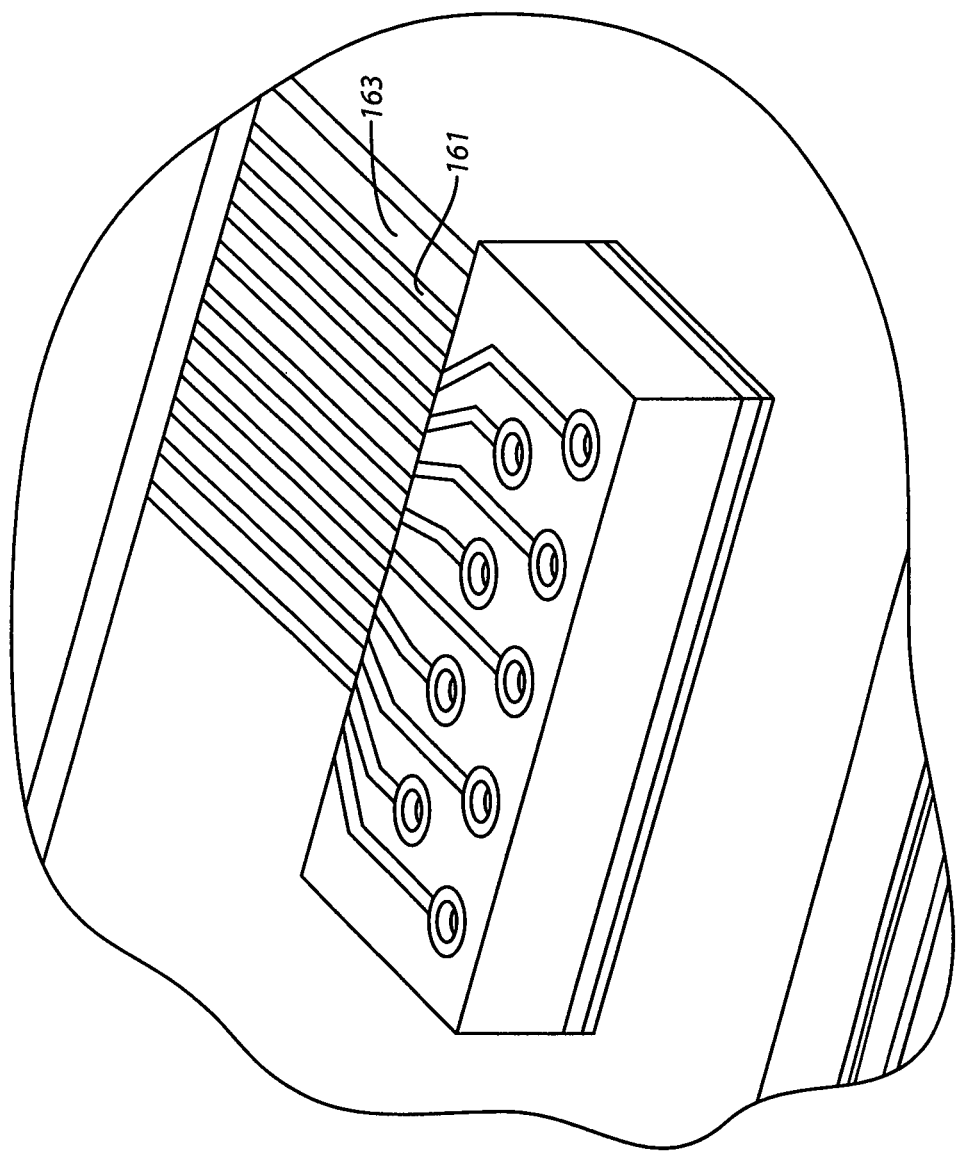
FIG. 12 comprises one example of an electrical trace element according to various embodiments of the present invention.

Referring now to FIG. 11, one example of a method of manufacturing a module is described. It will be appreciated that the steps described below are one example only of a construction/assembly method and may be varied according to the needs of the user and the requirements of the module that is to be formed.

At step 1102, an outer housing is formed and the outer housing includes a conductive material and an additive. The conductive material and the additive act to provide electromagnetic compatibility (EMC) shielding for electrical components disposed within the outer housing. For example, the module can be composed of PC/ABS and the additive can be composed of carbon fiber.

At step 1104, at least one non-conductive holder is formed and the non-conductive holders are integrated with the outer housing. The holder can be formed so as to be coextensive with the housing (e.g., molded together) or may be formed separately and attached to the housing with fasteners or some other arrangement.

At step 1106, at least one circuit board is slid into attachment with the at least one non-conductive holder. In this approach, the attachment of the circuit boards occurs without the use of fasteners to hold the circuit board in place.

As mentioned, the housing and its components may be assembled according to a variety of different approaches. For instance, a series of molding events may occur (e.g., in-mold assembly events) that progressively add the various parts of the final module by molding the shell first and then adding the insulator and conductive features. Alternatively, various parts of the outer housing can be created with traditional fabrication techniques or processes, a single shot molding approach, or insert molded. In still another example, multi-shot and then attached to the outer shell using snap-fit approaches. In still other approaches, the outer housing or shell itself may be produced in any number of sub-components from, for example, two parts or several with the needed conductive and insulator features added to the various walls, floors or ceiling of the module by an in-mold assembly process. The final assembly using this later approach may consist of snapping the components together.

Thus, housings for electronic components are provided that provide EMC shielding for the electronic components within the housing and incorporate many features that are secondary or additional to the overall housing structure. For example, circuit boards may be slid into and out of the housing without the need to mate connectors in a secondary process or apply fasteners to retain various parts. Electrical interconnections need not be applied and reapplied. In so doing, additional processes used in the prior art are eliminated (e.g., such as manually making connections in place). In other words, a functional integration of housing elements is achieved allowing easier user interaction, reducing assembly times, reducing costs, and reducing user frustration. Methods of manufacturing these modules are also provided.

Those skilled in the art will recognize that a wide variety of modifications, alterations, and combinations can be made with respect to the above described embodiments without departing from the spirit and scope of the invention, and that such modifications, alterations, and combinations are to be viewed as being within the scope of the invention.

What is claimed is:

1. A module comprising:
   an outer housing comprising a top, bottom, and first and second opposing sides and which are molded as a unitary structure using a thermally robust plastic comprised of an electrically conductive additive to the plastic;
   a first holder disposed so as to be in integral relationship the outer housing;
   a second holder disposed so as to be in integral relationship with the outer housing;
   a first circuit board in removable engagement with first holder, the first circuit board adapted to being held in place by the holder without the use of a fastener;
   a second circuit board in removable engagement with the second holder, the second circuit board adapted to being held in place by the holder without the use of a fastener;
   at least one electrical trace element disposed so as to be in integral relationship with the outer housing and comprising a conductive portion and an insulator portion, the at least one electrical trace element being coupled to the first circuit board at a first connector and coupled to the second circuit board at a second connector, the conductive portion being configured to provide a first electrical pathway between the first circuit board and the second circuit board, wherein the insulator portion and the additive act to provide electromagnetic compatibility (EMC) shielding for electrical components disposed within the outer housing;
   a third connecter coupled to the at least one electrical trace element, the third connector being disposed so as to be in integral relationship with the outer housing, the third connector not being integrated with the first circuit board and not being integrated with the second circuit board, the third connector providing a second electrical pathway from at least one of the first circuit board or second circuit board to a device external of the outer housing.

2. The module of claim 1 wherein the first holder and the second holder are fastened to the outer housing via a fastener.

3. The module of claim 1 wherein the first holder and the second holder are formed so as to be coextensive with the outer housing.

4. The module of claim 1 wherein the insulator portion of the at least one electrical trace element comprises a material selected from the group consisting of a non-conductive plastic, a non-conductive silicone, and a non-conductive rubber.

5. The module of claim 1 wherein the outer housing comprises a material selected from the group consisting of a conductive plastic, a conductive silicone, and a conductive rubber.

6. A method of manufacturing a module, the module including electronic components comprising:
   forming an outer housing, the outer housing comprising a top, bottom, a first and second opposing sides and which are molded together as a unitary structure using a thermally robust plastic comprised of an electrically conductive additive to the plastic;
   integrating a trace element with the outer housing, the trace element including a conductive material and an insulator material;
   shielding an interior of the housing from electromagnetic effects utilizing the additive and the insulator material;

forming at least one non-conductive holder and integrating the at least one non-conductive holder with the outer housing;

sliding at least one circuit board into attachment with the at least one non-conductive holder, the attachment occurring without the use of fasteners to hold the circuit board in place.

7. The method of claim 6 further comprising providing a grounding path from the circuit board to ground via the outer housing.

8. The method of claim 6 further comprising providing an electrical path to the circuit board via the conductive material of the trace element.

9. The method of claim 6 wherein the outer housing is formed from a molding process.

10. The method of claim 6 wherein the at least one non-conductive holder is separately formed and attached to the outer shell.

11. The method of claim 6 wherein the outer shell comprises a plurality of sub-portions.

12. The method of claim 6 wherein the holder is formed first and the outer shell is subsequently formed around the at least one holder and around the at least one conductive element.

13. The method of claim 6 wherein any of the outer shell or holder are formed from a molding process selected from the group consisting of single-shot molding, multi-shot molding, and insert molding.

* * * * *